United States Patent
Liu et al.

(10) Patent No.: US 9,269,712 B2
(45) Date of Patent: Feb. 23, 2016

(54) SEMICONDUCTOR DEVICE PROVIDING ENHANCED FIN ISOLATION AND RELATED METHODS

(71) Applicants: STMicroelectronics, Inc., Coppell, TX (US); GLOBALFOUNDRIES Inc., Grand Cayman (KY)

(72) Inventors: Qing Liu, Guilderland, NY (US); Ruilong Xie, Schenectady, NY (US); Hyun-Jin Cho, Palo Alto, CA (US)

(73) Assignees: STMICROELECTRONICS, INC., Coppell, TX (US); GLOBALFOUNDRIES INC, Grand Cayman (KY)

( * ) Notice: Subject to any disclaimer, the term of this patent is extended or adjusted under 35 U.S.C. 154(b) by 148 days.

(21) Appl. No.: 14/068,340

(22) Filed: Oct. 31, 2013

(65) Prior Publication Data
US 2015/0115370 A1 Apr. 30, 2015

(51) Int. Cl.
*H01L 27/088* (2006.01)
*H01L 29/161* (2006.01)
*H01L 21/8234* (2006.01)
*H01L 29/06* (2006.01)

(52) U.S. Cl.
CPC .... *H01L 27/0886* (2013.01); *H01L 21/823431* (2013.01); *H01L 29/0649* (2013.01); *H01L 29/161* (2013.01)

(58) Field of Classification Search
CPC .............. H01L 27/0886; H01L 29/161; H01L 29/0649
See application file for complete search history.

(56) References Cited

U.S. PATENT DOCUMENTS

| | | | |
|---|---|---|---|
| 8,076,190 B2 | 12/2011 | Chen et al. | |
| 8,310,013 B2 | 11/2012 | Lin et al. | |
| 8,501,607 B1 | 8/2013 | Juengling | |
| 8,541,286 B2 * | 9/2013 | Park | 438/427 |
| 8,866,204 B2 * | 10/2014 | Liu et al. | 257/288 |

\* cited by examiner

*Primary Examiner* — Robert Carpenter
(74) *Attorney, Agent, or Firm* — Allen, Dyer, Doppelt, Milbrath & Gilchrist, P.A.

(57) ABSTRACT

A method for making a semiconductor device may include forming a first semiconductor layer on a substrate comprising a first semiconductor material, forming a second semiconductor layer on the first semiconductor layer comprising a second semiconductor material, and forming mask regions on the second semiconductor layer and etching through the first and second semiconductor layers to define a plurality of spaced apart pillars on the substrate. The method may further include forming an oxide layer laterally surrounding the pillars and mask regions, and removing the mask regions and forming inner spacers on laterally adjacent corresponding oxide layer portions atop each pillar. The method may additionally include etching through the second semiconductor layer between respective inner spacers to define a pair of semiconductor fins of the second semiconductor material from each pillar, and removing the inner spacers and forming an oxide beneath each semiconductor fin.

10 Claims, 14 Drawing Sheets

SEMICONDUCTOR DEVICE PROVIDING ENHANCED FIN ISOLATION AND RELATED METHODS

FIELD OF THE INVENTION

The present invention relates to the field of electronic devices and, more particularly, to semiconductor devices and related methods.

BACKGROUND OF THE INVENTION

Fin-based field effect transistors (FINFETs) are vertical transistor devices in which a semiconductor fin is located on a substrate and is used to define the source, drain, and channel regions of the device. The gate structure overlies the fin in the channel area, and in some configurations multiple fins may be used to provide a multi-gate transistor architecture. The multiple gates may be controlled by a single gate electrode, where the multiple gate surfaces act electrically as a single gate, or by independent gate electrodes.

One example FINFET device is set forth in U.S. Pat. No. 8,310,013 to Lin et al. The FINFET device includes a substrate of a crystalline semiconductor material having a top surface of a first crystal plane orientation, a fin structure of the crystalline semiconductor material overlying the substrate, a gate structure over a portion of the fin structure, and an epitaxial layer over another portion of the fin structure. The epitaxial layer has a surface with a second crystal plane orientation. The epitaxial layer and underlying fin structure include a source and drain region. The source region is separated from the drain region by the gate structure. A channel is defined in the fin structure from the source region to the drain region, and aligned in a direction parallel to both the surface of the epitaxial layer and the top surface of the substrate.

Despite the existence of such configurations, further enhancements in FINFET devices may be desirable in some applications, particularly next generation devices with relatively small dimensions.

SUMMARY OF THE INVENTION

A method for making a semiconductor device may include forming a first semiconductor layer on a substrate comprising a first semiconductor material, forming a second semiconductor layer on the first semiconductor layer comprising a second semiconductor material, and forming mask regions on the second semiconductor layer and etching through the first and second semiconductor layers to define a plurality of spaced apart pillars on the substrate. The method may further include forming an oxide layer laterally surrounding the pillars and mask regions, and removing the mask regions and forming inner spacers on laterally adjacent corresponding oxide layer portions atop each pillar. The method may additionally include etching through the second semiconductor layer between respective inner spacers to define a pair of semiconductor fins of the second semiconductor material from each pillar, and removing the inner spacers and forming an oxide beneath each semiconductor fin.

More particularly, the first semiconductor material may be selectively etchable with respect to the second semiconductor material. The method may further include removing laterally adjacent portions of the oxide layer to expose the semiconductor fins. Moreover, the method may include laterally etching perimeter portions of the first semiconductor layer of each pillar prior to forming the oxide layer.

Etching may include etching through at least some of the first semiconductor layer. Also, etching may include etching through the first semiconductor layer and into the substrate. Etching may also include etching away all of the first semiconductor layer of each pillar.

By way of example, the first semiconductor material may comprise silicon germanium, and the second semiconductor material may comprise silicon. The method may further include forming a gate overlying the semiconductor fins. Also by way of example, the substrate may comprise silicon.

A related semiconductor device may include a substrate, an oxide layer on the substrate, and at least one pair of semiconductor fins on the oxide layer, each fin comprising a first semiconductor material. A semiconductor region may be within the oxide layer and between the at least one pair of semiconductor fins. The semiconductor region may comprise a second semiconductor material different than the first material.

Another related semiconductor device may include a substrate, an oxide layer on the substrate, and at least one pair of semiconductor fins on the oxide layer each comprising a first semiconductor material. The substrate may have a recess therein between the at least one pair of semiconductor fins, and the oxide layer may fill the recess.

DETAILED DESCRIPTION OF THE PREFERRED EMBODIMENTS

Figure 1:
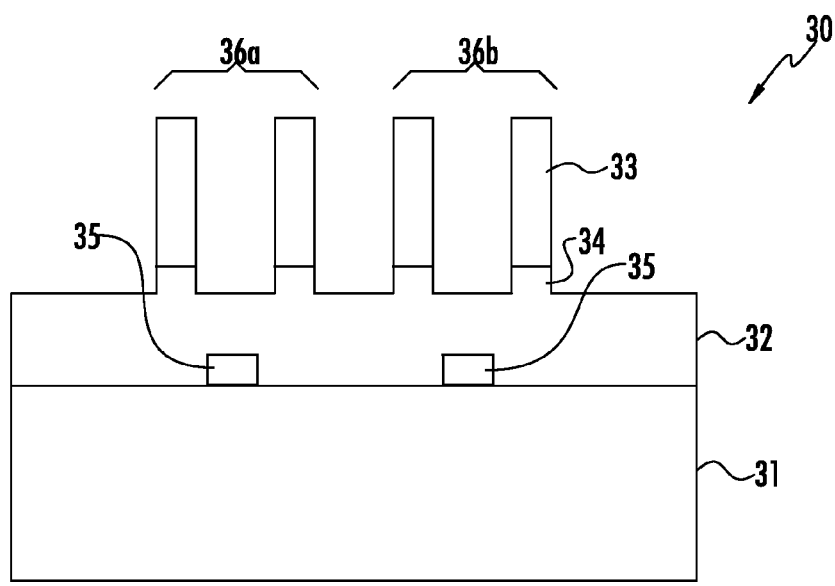
FIG. 1 is cross-sectional diagram of a semiconductor device in accordance with one example embodiment.
Figure 2:
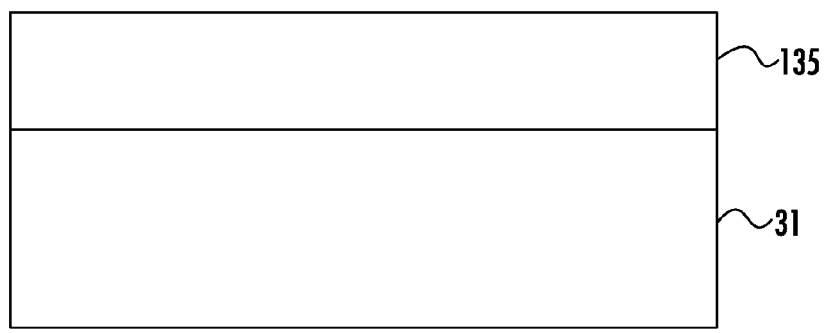
FIGS. 2-15 are a series of cross-sectional diagrams illustrating a method of making the semiconductor device of FIG. 1.
Figure 3:
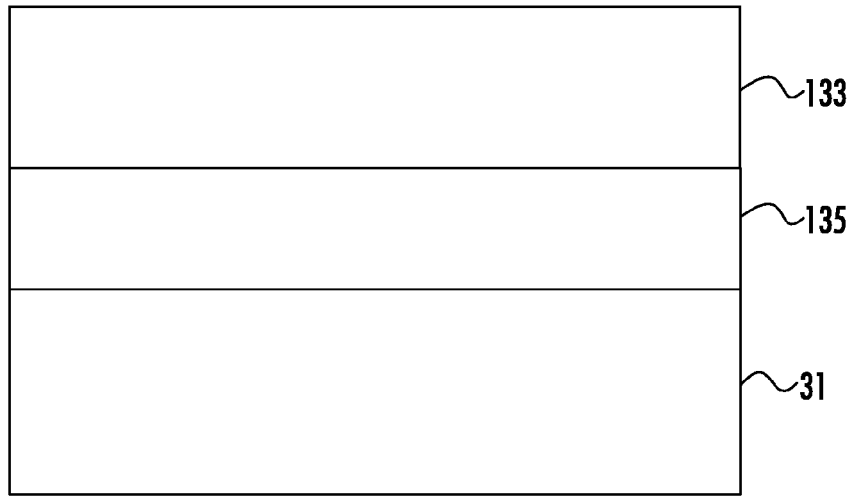

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime and multiple prime notation is used to indicate similar elements in different embodiments.

By way of background, bulk FINFET technology is desirable for future generation semiconductor devices. However, with grater integration densities may come certain challenges. One is that of fin uniformity, as it may be difficult to control fin dimensions to desired heights at relatively small sizes. Moreover, fin isolation may be a challenge, as the relatively small dimensions may make it difficult to prevent leakage through the bulk substrate under the fins, for example. To this end, it may be desirable to separate the bottom of the fins as much as possible to help prevent leakage, but this may be difficult on a buried oxide (BOX) substrate, as it may be difficult to form high density bulk FINFETs on such a substrate due to spacing considerations.

Turning to FIGS. 1-15, an example FINFET device 30 and associated method for making the same, which may help alleviate the above-noted issues with bulk scale integration, are first described. The device 30 illustratively includes a substrate 31, such as a silicon substrate, an oxide layer 32 on the substrate, and a plurality of semiconductor (e.g., silicon) fins 33 on the oxide layer. More particularly, the oxide layer 32 defines a plurality of raised portions or steps 34, upon which respective fins 33 sit atop. In the illustrated embodiment, a respective semiconductor region 35a, 35b is positioned within the oxide layer 31 between adjacent pairs 36a, 36b of semiconductor fins 33. In particular, the semiconductor regions 35a, 35b may comprise a semiconductor material different than the semiconductor material of the fins. In accordance with one example, the semiconductor regions 35a, 35b may be silicon-germanium regions, although other semiconductor materials may also be used in some embodiments.

The FINFET 30 may have certain advantages in that the bottom surface of the fins 33 may be relatively "flat". By way of example, the fins 33 may have a height variation of about ±2 nm, whereas a typical FINFET process may result in a fin height variation of ±4 nm or more. Moreover, the approach for making the FINFET 30 may advantageously help reduce leakage by providing desired separation between the bottoms of the fins.

Figure 4:
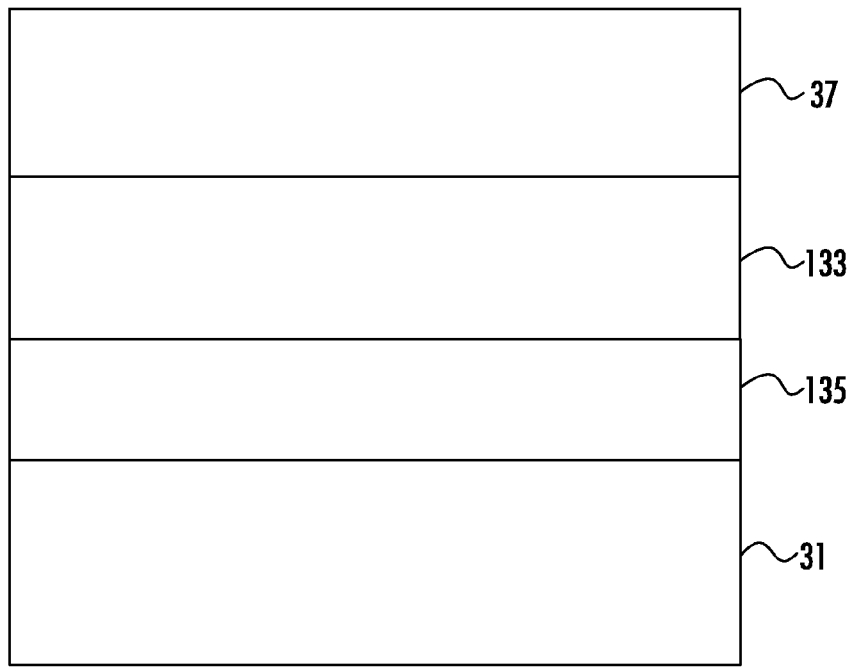
Figure 5:
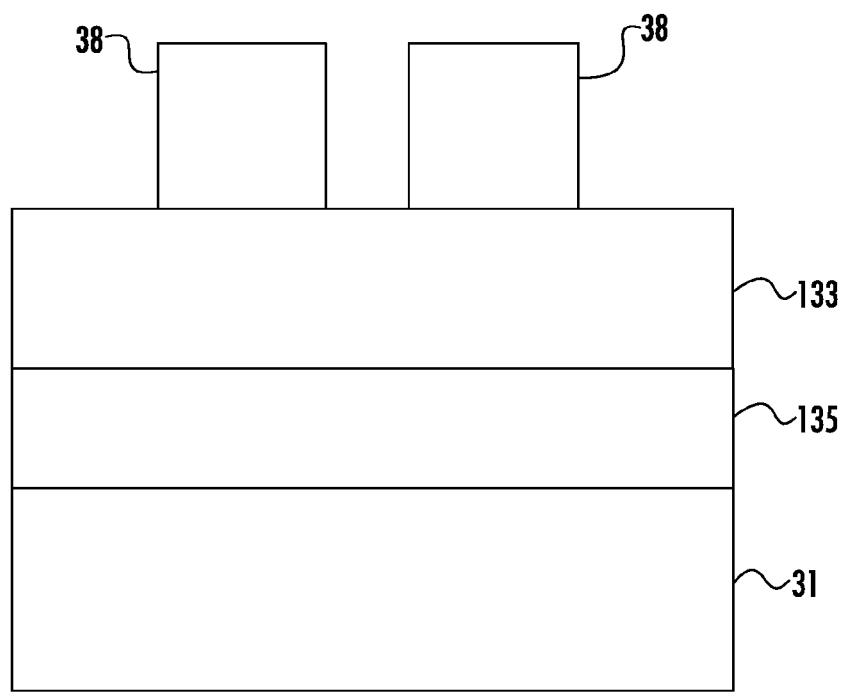
Figure 6:
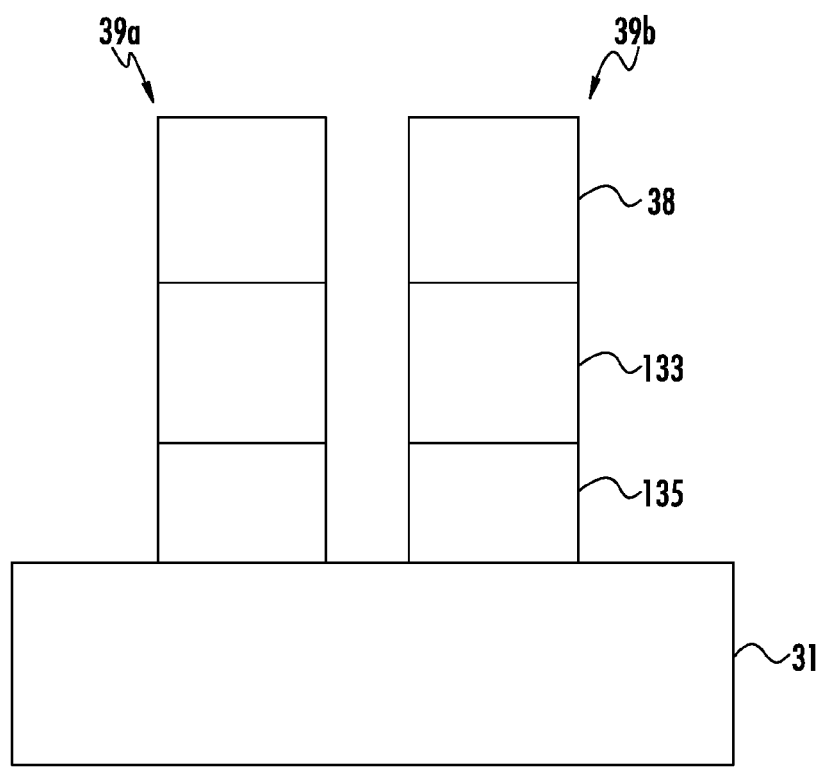
Figure 7:
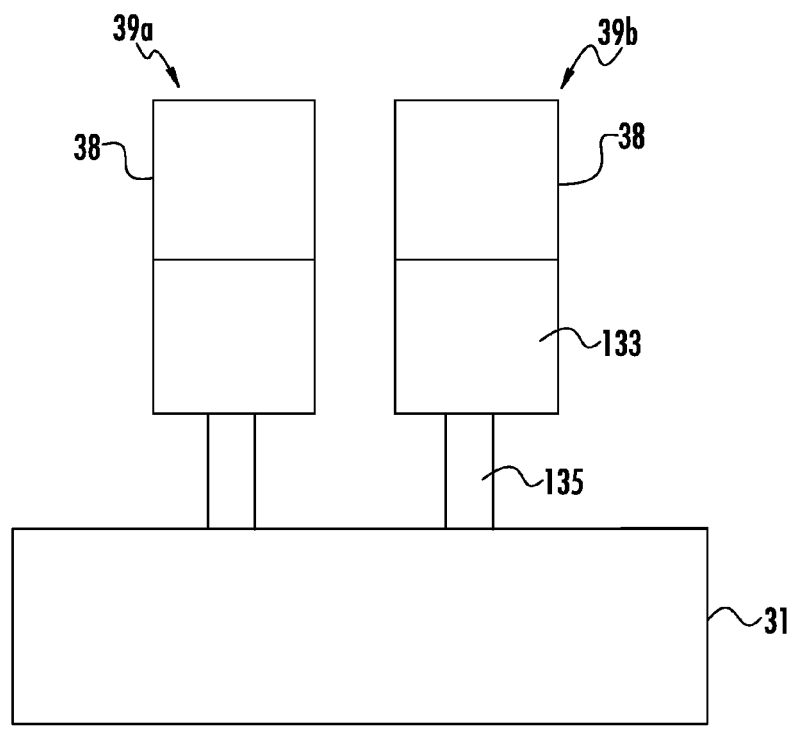

More particularly, the method for making the device 30 may include forming a first semiconductor layer 135 on the substrate 31 (FIG. 2) comprising a first semiconductor material, e.g., epitaxial silicon germanium. Remnants from the first semiconductor layer 135 will later form the semiconductor regions 35, as will be discussed further below. The method further includes forming a second semiconductor layer 133 on the first semiconductor layer 135 comprising a second semiconductor material (FIG. 3), e.g., epitaxial silicon. As seen in FIG. 4, a hard mask layer 37 (e.g., silicon nitride, etc.) is formed on the second semiconductor layer 133 and then patterned (FIG. 5) to form mask regions 38 on the second semiconductor layer. Using the mask regions 38, the first and second semiconductor layers 135, 133 may be etched to define a plurality of spaced apart pillars 39a, 39b on the substrate 31 (FIG. 6).

Figure 8:
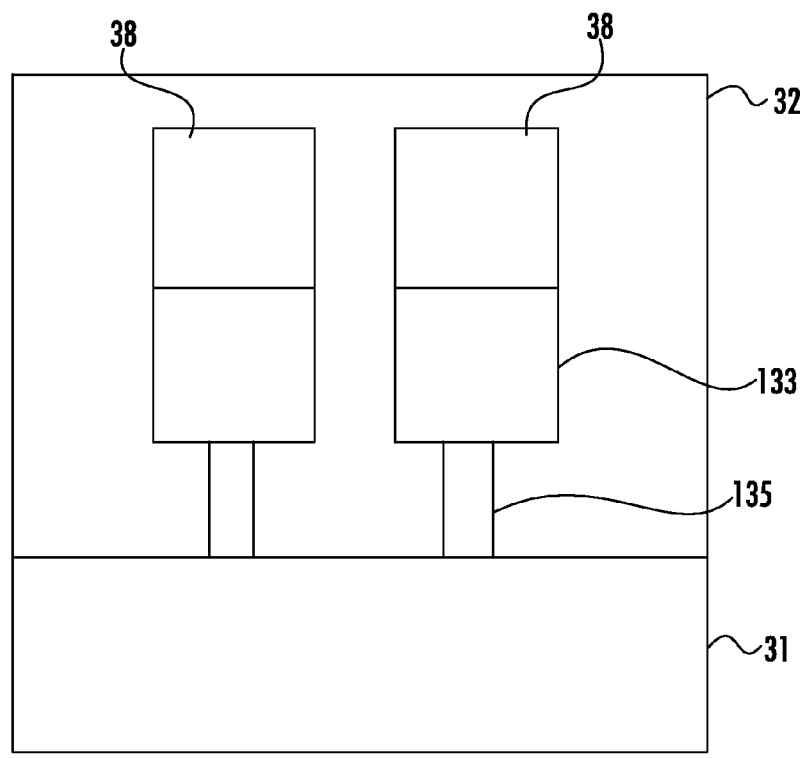
Figure 9:
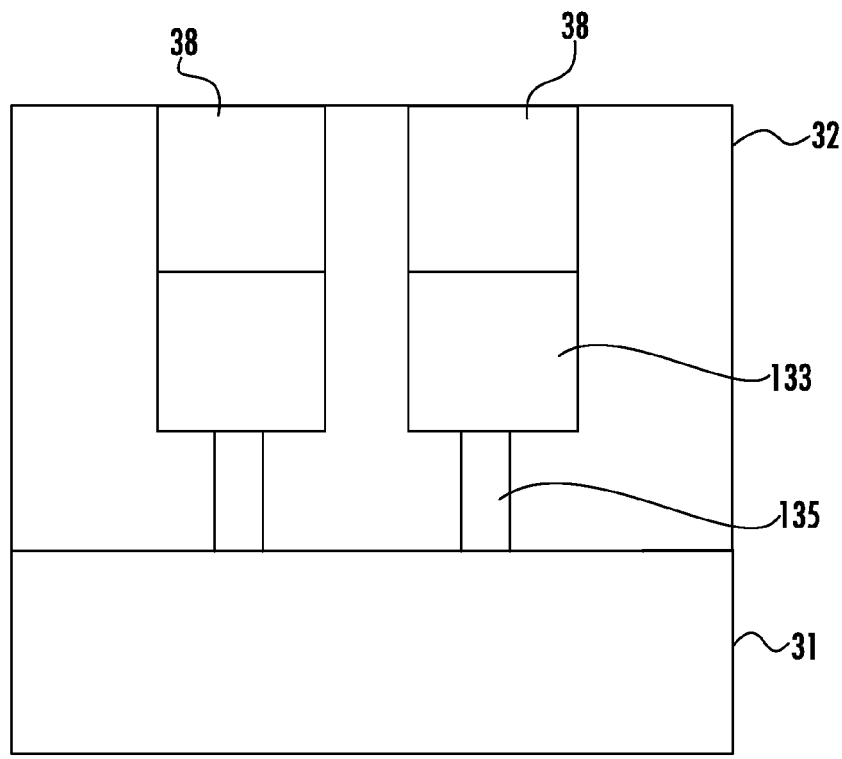
Figure 10:
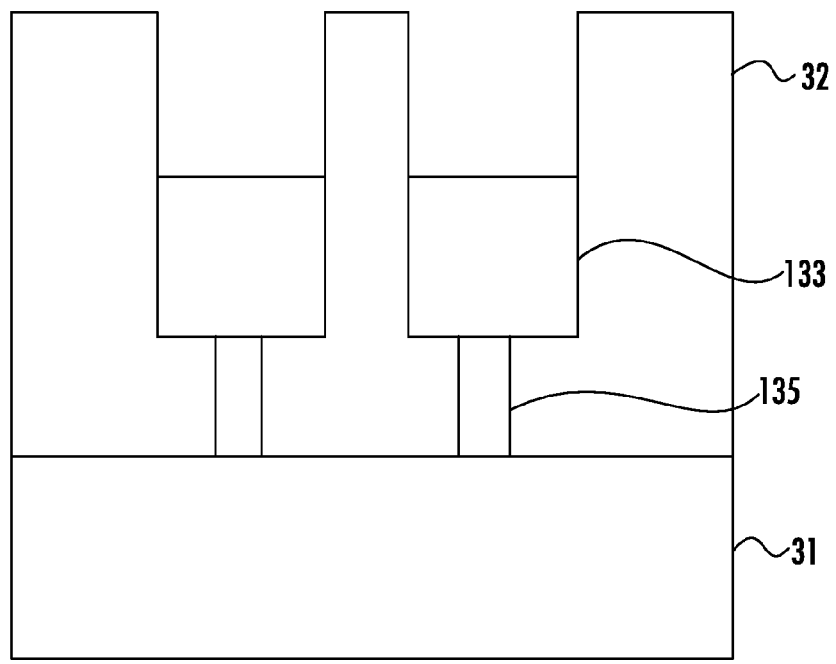

In the illustrated example, a selective lateral etch (i.e., selective to the silicon and silicon nitride) of the perimeter or outer portions of the silicon germanium in the first semiconductor layer 135 of each pillar 39a, 39b is performed (FIG. 7) so that the silicon germanium is of a reduced width. By way of example, an HCl acid etch at ambient temperature may be used for the selective etching of the silicon germanium. The method further illustratively includes forming an oxide layer laterally surrounding the pillars 39a, 39b and mask regions 38, as seen in FIG. 8. By way of example, a flowable oxide overfill may be used for form the oxide layer 32, as will be appreciated by those skilled in the art. The oxide layer 32 may then be planarized (e.g., via chemical-mechanical polishing (CMP)), as seen in FIG. 9, and the mask regions 38 removed by etching away, for example (FIG. 10).

Figure 11:
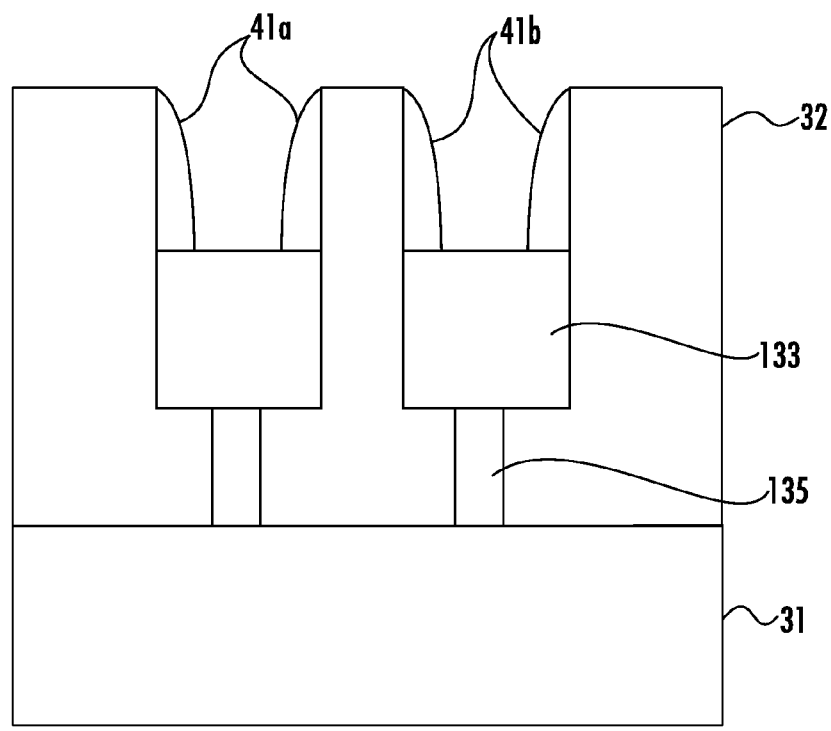
Figure 12:
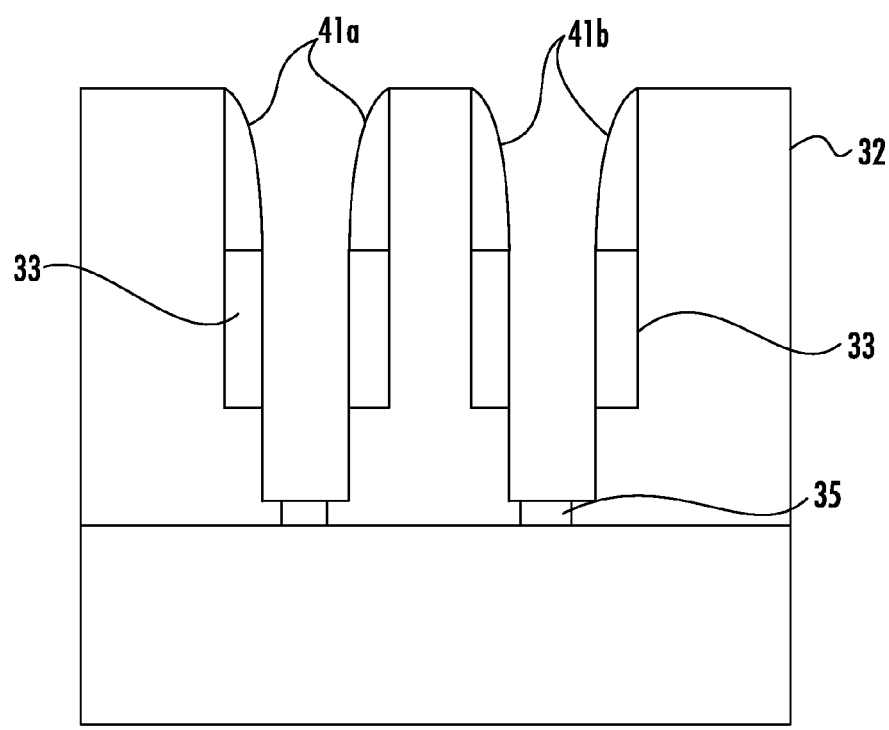
Figure 13:
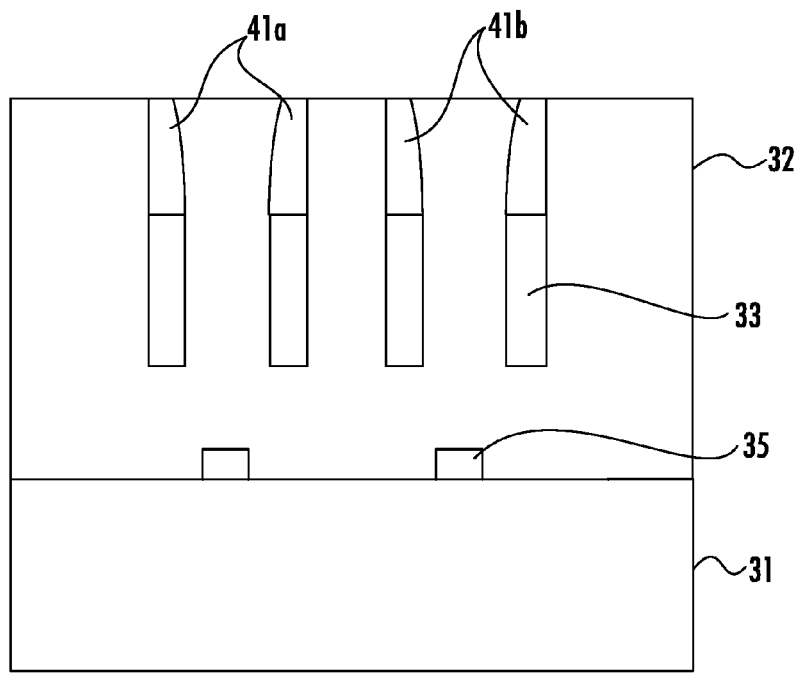
Figure 14:
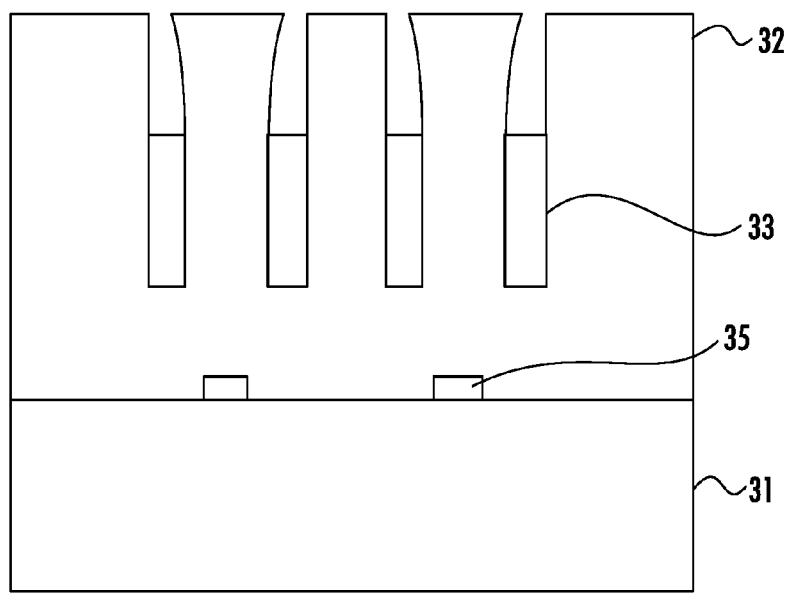

As seen in FIG. 11, inner spacers 41a, 41b may be formed on laterally adjacent corresponding oxide layer portions 32 atop each pillar 39a, 39b (i.e., on top of the second semiconductor layer 133 portion of each pillar). The inner spacers 41a, 41b provide an alignment guide or mask for etching through the second semiconductor layer 133 between respective inner spacers to define respective pairs of the semiconductor fins 33 from each pillar 39a, 39b (FIG. 12). By stopping the etch before it goes all the way through the remaining silicon germanium portions of the first semiconductor layer 135 of each pillar 39a, 39b, this leaves the silicon germanium regions 35 as remnants or artifacts within the oxide layer 32. It will be appreciated that since the etching occurs between the inner spacers 41a, 41b, the silicon germanium regions 35 will have a width that is less than a distance between the inner surfaces of adjacent pairs 36a, 36b of fins 33. As will be discussed further below, the silicon germanium may be fully etched through or removed in other embodiments to form different configurations.

Figure 15:
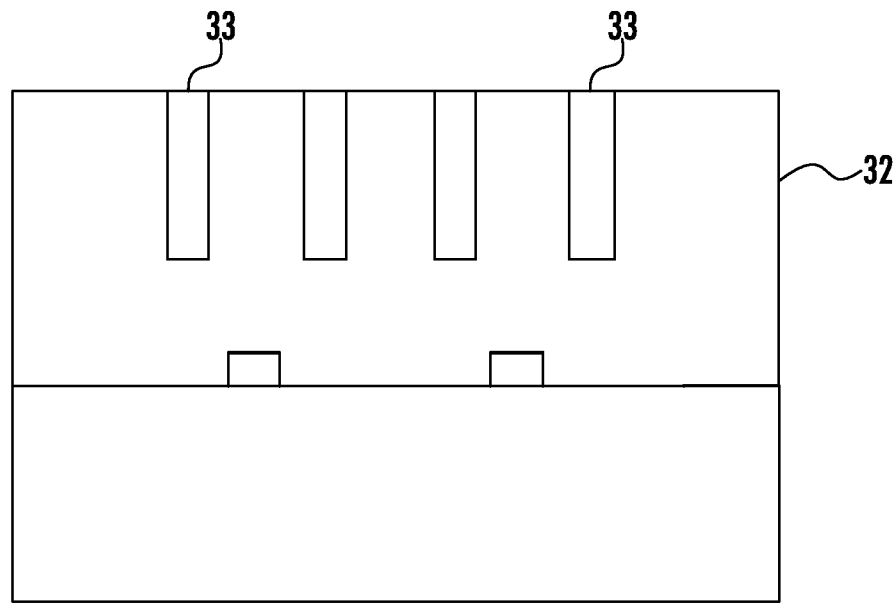

The trenches formed by the etching may then be filled with more oxide (FIG. 13), which may be planarized (e.g., CMP) down to the inner spacers 41a, 41b. This additional oxide encloses or surrounds the bottoms and sides of each fin 33 with the insulating oxide material. The inner spacers 41a, 41b are removed (FIG. 14) or etched back, and another CMP operation may be performed to remove the oxide layer down to the tops of the fins 33 (FIG. 15). The oxide layer 32 may then be recessed to reveal the fins 33, as seen in FIG. 1.

As a result of the above-described process, the fin height may be better controlled to the tolerances mentioned above, as the fins 33 are epitaxially grown to the desired height. Moreover, the above approach allows insulating oxide to be grown underneath the fins 33 starting from a semiconductor substrate, and not a BOX (silicon-on-insulator, or SOI) substrate, which allows for relatively easier processing while still retaining the benefits of an SOI substrate, as will be appreciated by those skilled in the art.

Figure 16:
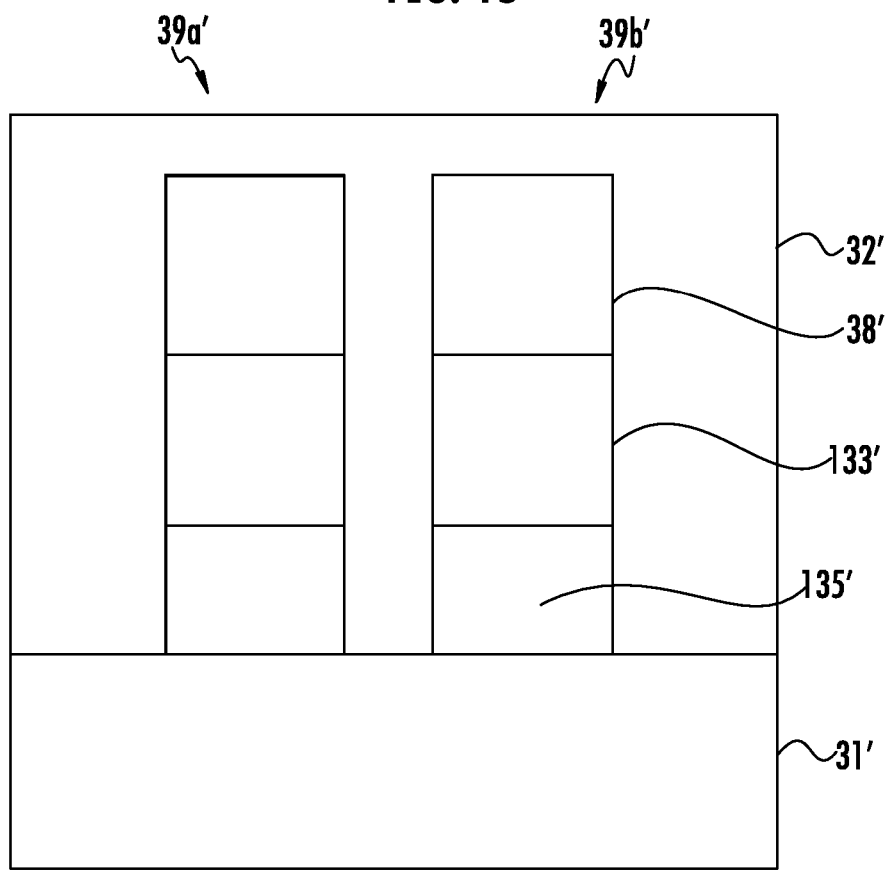
FIGS. 16-25 are a series of cross-sectional diagrams illustrating a method of making a semiconductor device in accordance with another example embodiment.
Figure 17:
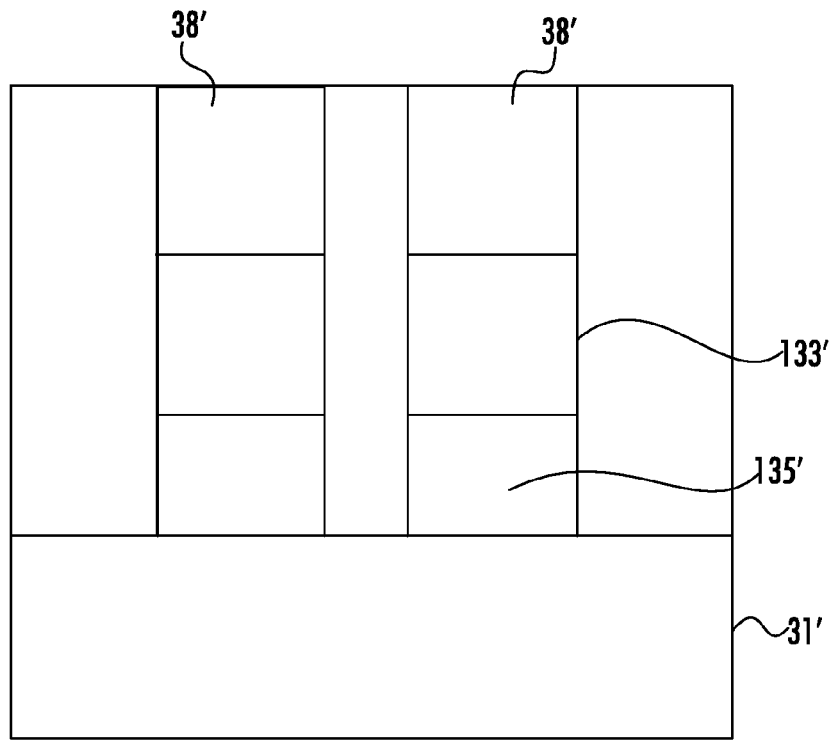
Figure 18:
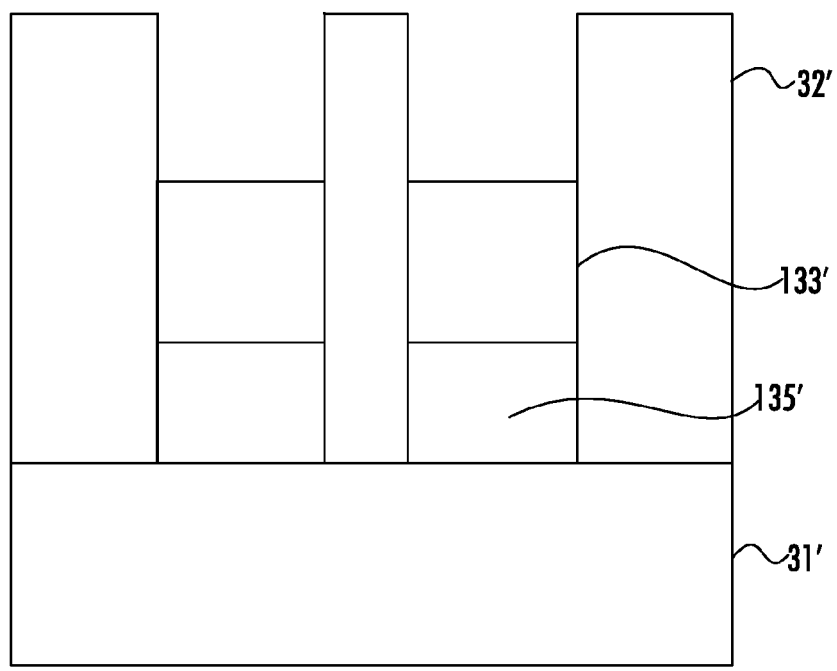
Figure 19:
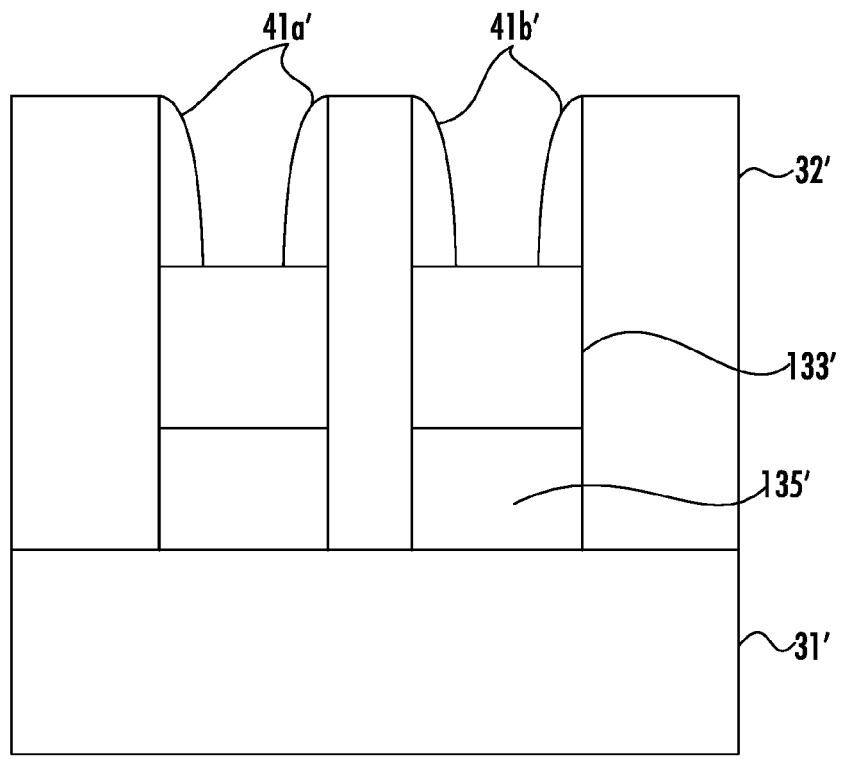
Figure 20:
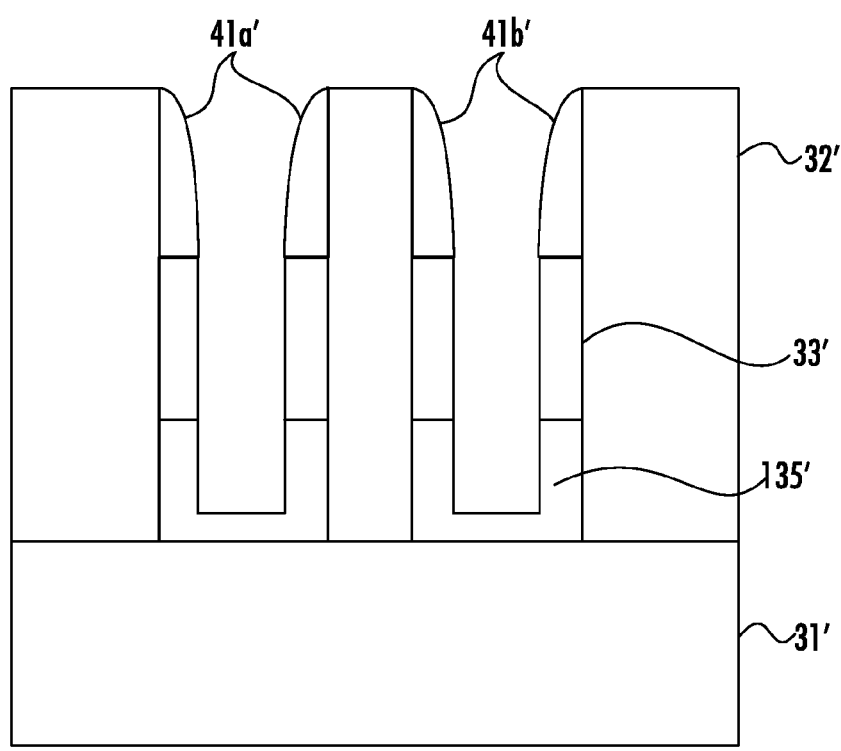
Figure 21:
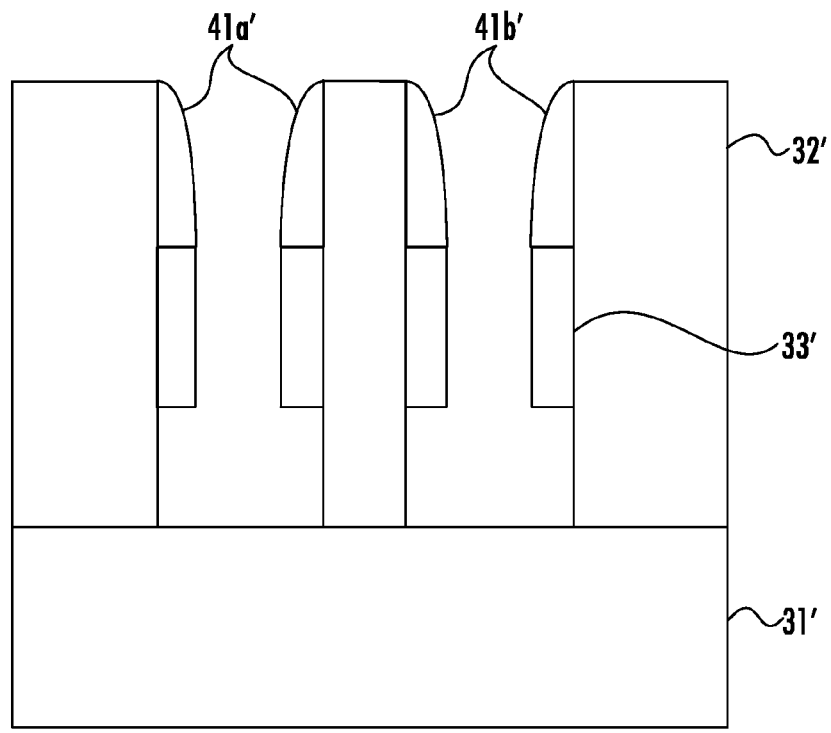
Figure 22:
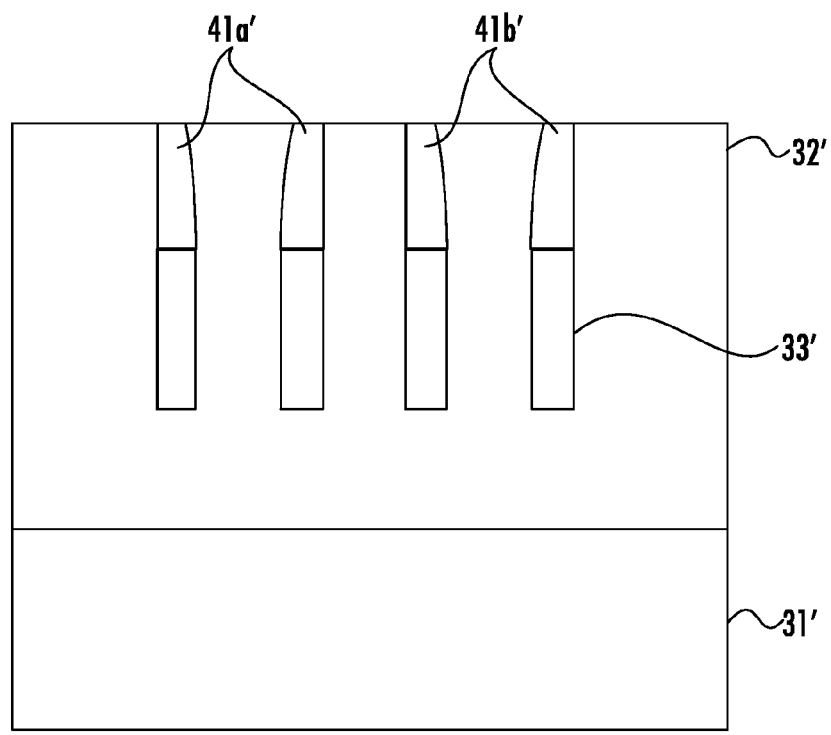
Figure 23:
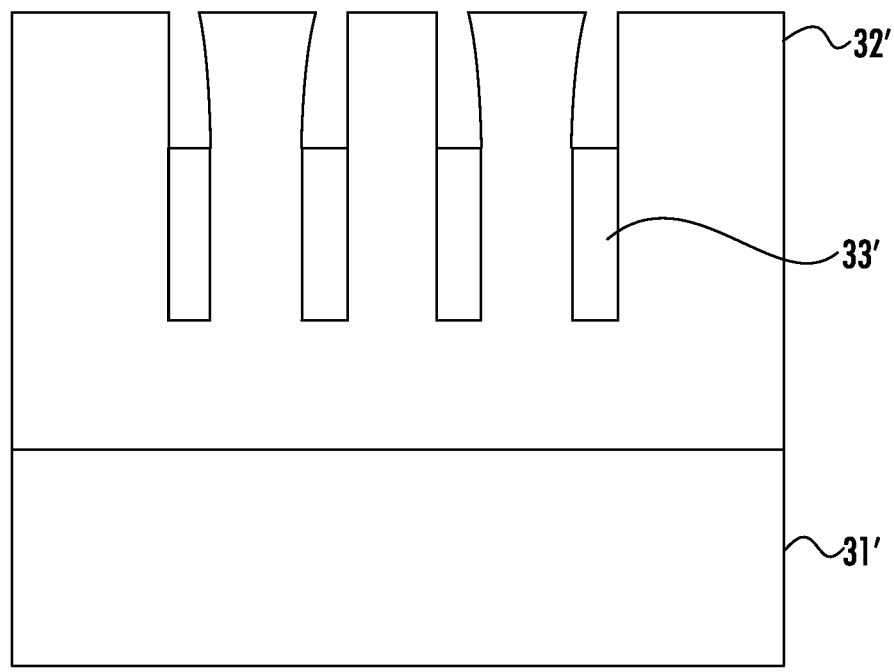
Figure 24:
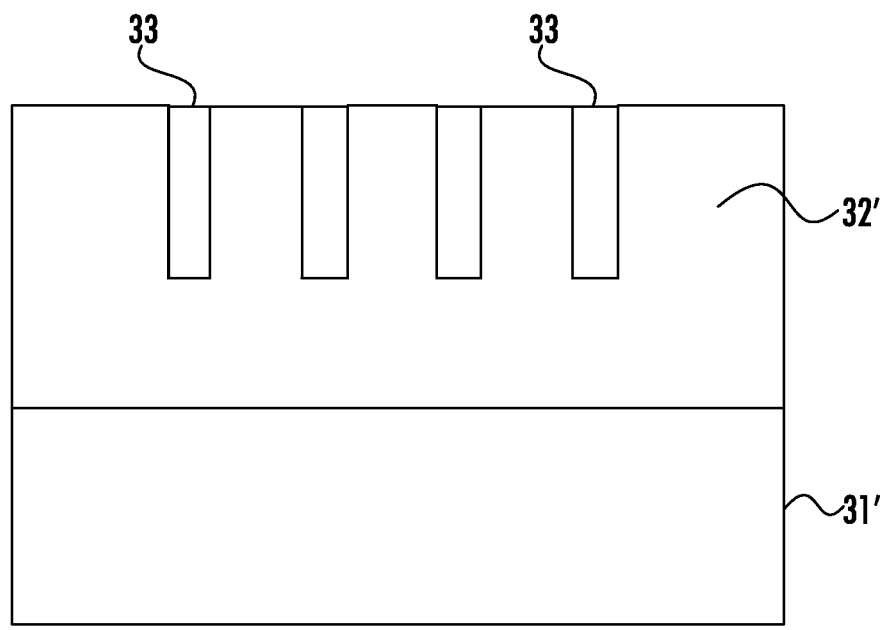
Figure 25:
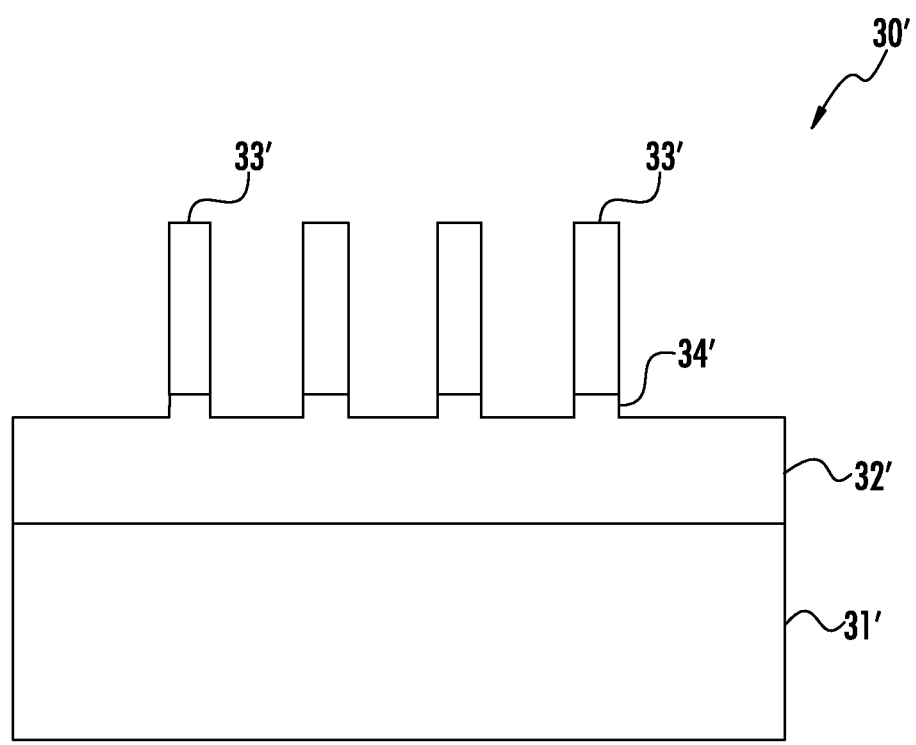

Referring now additionally to FIGS. 16-26, an approach for making another embodiment of the FINFET device 30' is now described. In this embodiment, the processing steps shown in FIGS. 1-6 would be the same as those described above, but instead of laterally etching the silicon germanium layer 135 of each pillar 39a, 39b, the process would proceed directly to forming the oxide layer 32' (e.g., flowable oxide, etc.) around the pillars 39a', 39b', as seen in FIG. 16. Further steps of planarizing the oxide layer 32' to the top of the mask regions 38' (FIG. 17), removing the mask regions (FIG. 18), forming the inner spacers 41a', 41b' (FIG. 19), and etching through the inner spacers (FIG. 20) may be performed as described above with respect to FIGS. 9-12.

Figure 26:
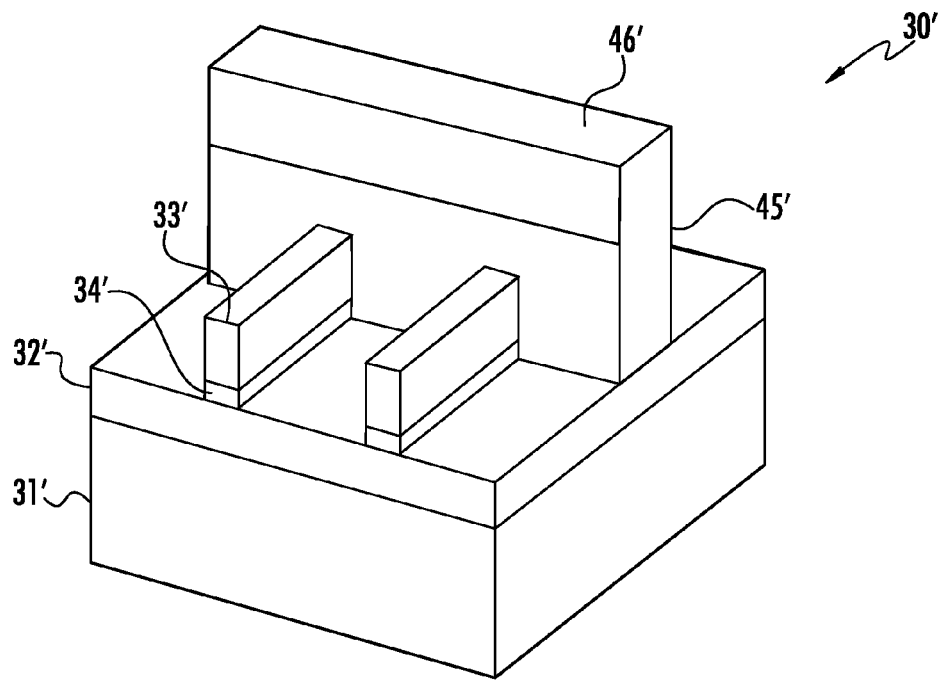
FIG. 26 is a perspective view of the semiconductor device of FIG. 25.

At this point, the remaining silicon germanium layer portions 135' have the form of a "U" shape, with the vertical portions of the "U" being underneath the fins 33'. A selective removal of the silicon germanium (relative to the silicon of the fins 33' and the silicon nitride of the mask region 38') is then performed (FIG. 21) to expose the bottoms of the fins. Additional steps of filling in the etched areas with oxide 32' (FIG. 22), removing the inner spacers 41a', 41b' (FIG. 23), planarizing the oxide layer (FIG. 24), and etching back the oxide layer to reveal the fins 33 (FIG. 25), are again similar to those steps described above. However, with this approach there will be no residual semiconductor regions 35a', 35b', as the silicon germanium is removed by etching prior to filling in the oxide underneath the fins 33'. Yet, this configuration may still provide the same advantages described above of predictable fin height and isolation between the fins 33, as will be appreciated by those skilled in the art. A three-dimensional perspective view of the semiconductor device 30' with a gate 45' (e.g., a replacement metal gate, RMG, etc.) and overlying nitride cap 46' is shown in FIG. 26.

Figure 27:
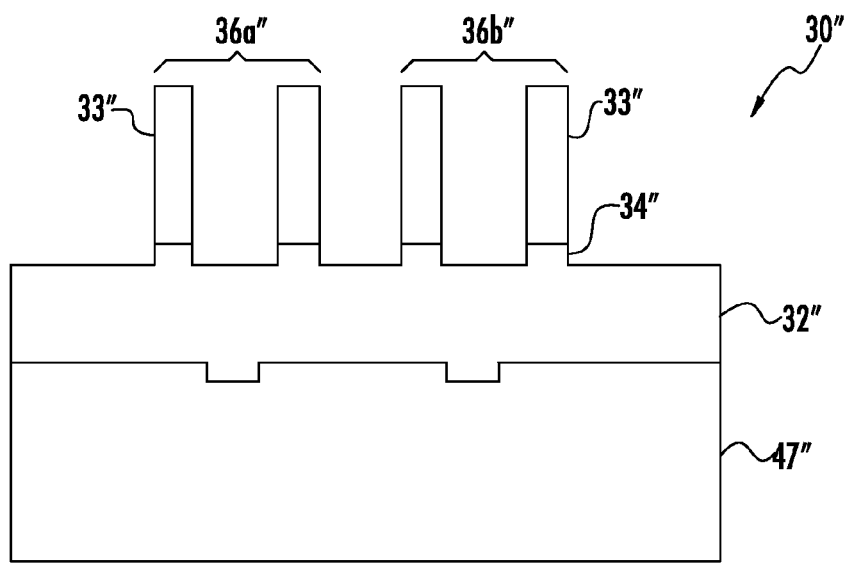
FIG. 27 is a cross-sectional diagram of another semiconductor device in accordance with an example embodiment.

Still another embodiment of the semiconductor device 30" is now described with reference to FIG. 27. The semiconductor device 30" would be made in a similar fashion to the semiconductor device 30, except that when the etching is performed between the inner spacers 41a, 41b (FIG. 12), a longer etch would be used to not only etch all the way through the silicon germanium of the first layer 135, but also to etch into the substrate 31". This would leave small "dents" or recesses 47" in the substrate 31" that are filled with oxide as shown. Here again, the recesses 47" will have a width that is less than a distance between the inner surfaces of adjacent pairs 36a", 36b" of fins 33".

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method for making a semiconductor device comprising:
    forming a first semiconductor layer on a substrate comprising a first semiconductor material;
    forming a second semiconductor layer on the first semiconductor layer comprising a second semiconductor material;
    forming mask regions on the second semiconductor layer and etching through the first and second semiconductor layers to define a plurality of spaced apart pillars on the substrate;
    forming an oxide layer laterally surrounding the pillars and mask regions;
    removing the mask regions and forming inner spacers on laterally adjacent corresponding oxide layer portions atop each pillar;
    etching through the second semiconductor layer between respective inner spacers to define a pair of semiconductor fins of the second semiconductor material from each pillar; and
    removing the inner spacers and forming an oxide beneath each semiconductor fin.

2. The method of claim 1 wherein the first semiconductor material is selectively etchable with respect to the second semiconductor material.

3. The method of claim 1 further comprising removing laterally adjacent portions of the oxide layer to expose the semiconductor fins.

4. The method of claim 1 further comprising laterally etching perimeter portions of the first semiconductor layer of each pillar prior to forming the oxide layer.

5. The method of claim 1 wherein etching comprises etching through at least some of the first semiconductor layer.

6. The method of claim 1 wherein etching comprises etching through the first semiconductor layer and into the substrate.

7. The method of claim 1 wherein etching comprises etching away all of the first semiconductor layer of each pillar.

8. The method of claim 1 wherein the first semiconductor material comprises silicon germanium, and the second semiconductor material comprises silicon.

9. The method of claim 1 further comprising forming a gate overlying the semiconductor fins.

10. The method of claim 1 wherein the substrate comprises silicon.

* * * * *